United States Patent
Hasegawa et al.

(10) Patent No.: US 12,148,596 B2
(45) Date of Patent: Nov. 19, 2024

(54) HIGH-FREQUENCY POWER SUPPLY DEVICE

(71) Applicant: DAIHEN Corporation, Osaka (JP)

(72) Inventors: Yuichi Hasegawa, Osaka (JP); Yuya Ueno, Osaka (JP)

(73) Assignee: DAIHEN Corporation, Osaka (JP)

( * ) Notice: Subject to any disclaimer, the term of this patent is extended or adjusted under 35 U.S.C. 154(b) by 201 days.

(21) Appl. No.: 18/086,396

(22) Filed: Dec. 21, 2022

(65) Prior Publication Data

US 2023/0207270 A1    Jun. 29, 2023

(30) Foreign Application Priority Data

Dec. 28, 2021 (JP) .................. 2021-214971

(51) Int. Cl.
    *H01J 37/32*        (2006.01)
(52) U.S. Cl.
    CPC .. *H01J 37/32183* (2013.01); *H01J 37/32165* (2013.01)
(58) Field of Classification Search
    CPC .......... H01J 37/32183; H01J 37/32165; H01J 37/32155
    See application file for complete search history.

(56) References Cited

U.S. PATENT DOCUMENTS

| | | |
|---|---|---|
| 9,030,101 B2 | 5/2015 | Valcore, Jr. et al. |
| 9,114,666 B2 | 8/2015 | Valcore, Jr. et al. |
| 9,171,699 B2 | 10/2015 | Valcore, Jr. et al. |
| 9,197,196 B2 | 11/2015 | Valcore, Jr. et al. |
| 9,236,228 B2 | 1/2016 | Valcore, Jr. et al. |
| 9,295,148 B2 | 3/2016 | Fong et al. |
| 9,320,126 B2 | 4/2016 | Valcore, Jr. et al. |
| 9,337,000 B2 | 5/2016 | Marakhtanov et al. |
| 9,368,329 B2 | 6/2016 | Valcore, Jr. et al. |
| 9,390,893 B2 | 7/2016 | Valcore, Jr. et al. |
| 9,401,264 B2 | 7/2016 | Marakhtanov et al. |
| 9,462,672 B2 | 10/2016 | Valcore, Jr. et al. |
| 9,502,216 B2 | 11/2016 | Valcore, Jr. et al. |

(Continued)

FOREIGN PATENT DOCUMENTS

| | | |
|---|---|---|
| JP | 2017-188434 A | 10/2017 |
| JP | 2018-536295 A | 12/2018 |

*Primary Examiner* — Renan Luque
(74) *Attorney, Agent, or Firm* — Rimon P.C.

(57) ABSTRACT

A high-frequency power supply device includes: a first power supply that supplies first high-frequency power to a load by outputting a first high-frequency voltage having a first fundamental frequency; a second power supply that supplies second high-frequency power to the load by outputting a second high-frequency voltage having a second fundamental frequency lower than the first fundamental frequency; a first matching unit that performs a first matching operation of matching an impedance of the first power supply with an impedance of the load in a state in which intermodulation distortion caused by the first high-frequency power and the second high-frequency power being simultaneously supplied to the load, occurs. The first power supply frequency-modulates the first high-frequency voltage with a modulation signal having a same frequency as the second fundamental frequency to output a modulated wave after the first matching operation is completed.

5 Claims, 3 Drawing Sheets

(56) References Cited

U.S. PATENT DOCUMENTS

| | | |
|---|---|---|
| 9,530,620 B2 | 12/2016 | Valcore, Jr. |
| 9,607,810 B2 | 3/2017 | Valcore, Jr. et al. |
| 9,620,334 B2 | 4/2017 | Lyndaker et al. |
| 9,620,337 B2 | 4/2017 | Valcore, Jr. et al. |
| 9,711,332 B2 | 7/2017 | Howald et al. |
| 9,720,022 B2 | 8/2017 | Howald et al. |
| 9,779,196 B2 | 10/2017 | Valcore, Jr. et al. |
| 9,812,294 B2 | 11/2017 | Valcore, Jr. et al. |
| 9,831,065 B2 | 11/2017 | Fong et al. |
| 9,831,071 B2 | 11/2017 | Howald et al. |
| 9,837,252 B2 | 12/2017 | Howald et al. |
| 9,842,725 B2 | 12/2017 | Valcore, Jr. et al. |
| 9,947,514 B2 | 4/2018 | Radomski et al. |
| 9,960,015 B2 | 5/2018 | Valcore, Jr. et al. |
| 9,997,333 B2 | 6/2018 | Valcore, Jr. et al. |
| 10,008,371 B2 | 6/2018 | Valcore, Jr. et al. |
| 10,032,605 B2 | 7/2018 | Valcore, Jr. et al. |
| 10,074,520 B2 | 9/2018 | Valcore, Jr. et al. |
| 10,128,090 B2 | 11/2018 | Valcore, Jr. et al. |
| 10,157,729 B2 | 12/2018 | Valcore, Jr. |
| 10,157,730 B2 | 12/2018 | Marakhtanov et al. |
| 10,163,605 B2 | 12/2018 | Fong et al. |
| 10,231,321 B2 | 3/2019 | Valcore, Jr. et al. |
| 10,249,476 B2 | 4/2019 | Marakhtanov et al. |
| 10,256,077 B2 | 4/2019 | Valcore, Jr. et al. |
| 10,276,350 B2 | 4/2019 | Howald et al. |
| 10,296,676 B2 | 5/2019 | Howald et al. |
| 10,304,669 B1 | 5/2019 | Coumou et al. |
| 10,319,570 B2 | 6/2019 | Valcore, Jr. et al. |
| 10,325,759 B2 | 6/2019 | Valcore, Jr. et al. |
| 10,340,127 B2 | 7/2019 | Valcore, Jr. et al. |
| 10,381,201 B2 | 8/2019 | Lyndaker et al. |
| 10,403,482 B2 | 9/2019 | Howald et al. |
| 10,469,108 B2 | 11/2019 | Howald et al. |
| 10,474,780 B2 | 11/2019 | Valcore, Jr. et al. |
| 10,621,265 B2 | 4/2020 | Howald et al. |
| 10,629,413 B2 | 4/2020 | Valcore, Jr. et al. |
| 10,707,056 B2 | 7/2020 | Valcore, Jr. et al. |
| 10,748,748 B2 | 8/2020 | Valcore, Jr. et al. |
| 10,762,266 B2 | 9/2020 | Valcore, Jr. et al. |
| 10,853,444 B2 | 12/2020 | Valcore, Jr. et al. |
| 10,911,081 B2 | 2/2021 | Howald et al. |
| 11,361,942 B2 | 6/2022 | Valcore, Jr. et al. |
| 2016/0268100 A1 | 9/2016 | Valcore, Jr. et al. |
| 2017/0062187 A1 | 3/2017 | Radomski et al. |
| 2018/0082821 A1* | 3/2018 | Ikeda ................ H01J 37/32146 |
| 2018/0323038 A1 | 11/2018 | Valcore, Jr. et al. |
| 2019/0057845 A1* | 2/2019 | Nagami ............ H01J 37/32183 |
| 2019/0237300 A1* | 8/2019 | Ikeda ................ H01J 37/32192 |
| 2019/0318919 A1 | 10/2019 | Lyndaker et al. |

* cited by examiner

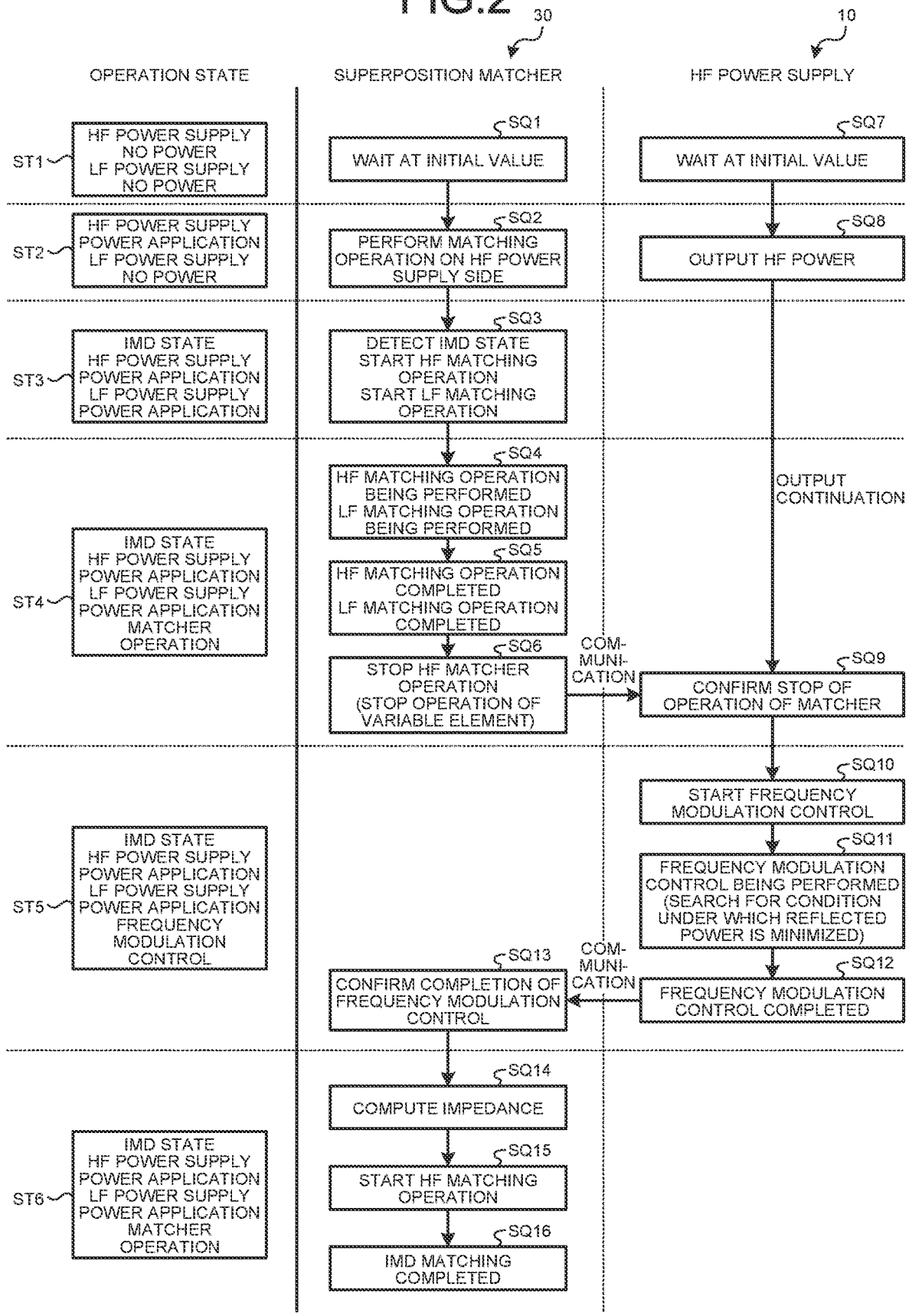

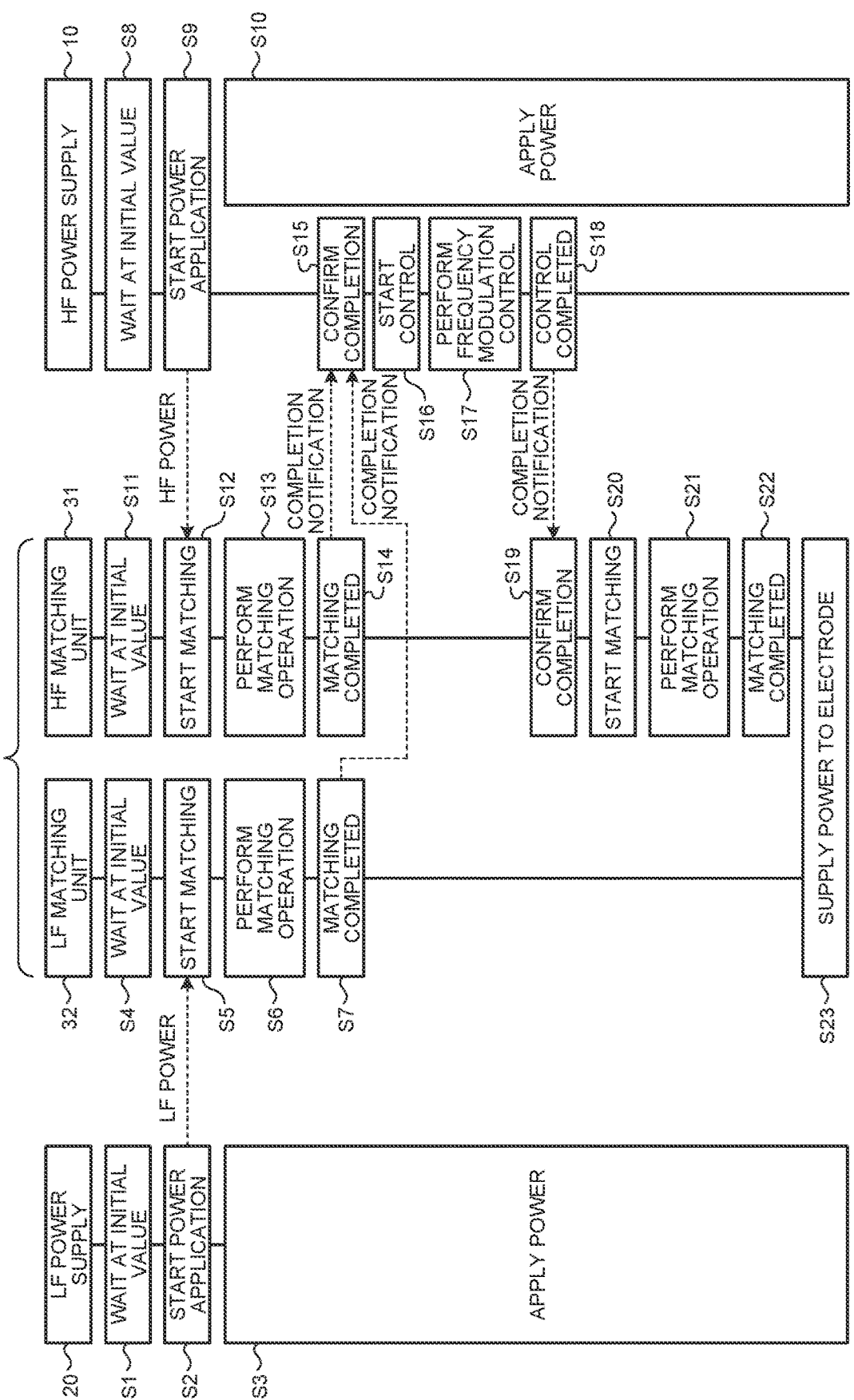

HIGH-FREQUENCY POWER SUPPLY DEVICE

CROSS-REFERENCE TO RELATED APPLICATIONS

This application is based upon and claims the benefit of priority from Japanese Patent Application No. 2021-214971, filed on Dec. 28, 2021, the entire contents of which are incorporated herein by reference.

FIELD

The present disclosure relates to a high-frequency power supply device.

BACKGROUND

A high-frequency power supply device used in a plasma processing device includes two high-frequency power supplies (a first power supply and a second power supply), and outputs high-frequency voltages having different fundamental frequencies (frequencies of fundamental waves) from the respective power supplies toward a load. For example, the first power supply supplies a first high-frequency power to the load by outputting a first high-frequency voltage having a first fundamental frequency F1 suitable for plasma generation. The second power supply supplies a second high-frequency power to the load by outputting a second high-frequency voltage having a second fundamental frequency F2 (first fundamental frequency F1>second fundamental frequency F2) suitable for ion acceleration. (See JP 2018-536295 A, JP 2017-188434 A, and U.S. Pat. No. 10,304,669).

In such a case, intermodulation distortion (IMD) occurs, and a phenomenon in which reflected wave power fluctuates according to the cycle of the second fundamental frequency F2 occurs on the first power supply side. In order to reduce the reflected wave power caused by the intermodulation distortion, a technique for performing frequency modulation control on the first power supply is known. At this time, in the high-frequency power supply device, when the matching operation for matching the impedance of the first power supply and the impedance of the load and the frequency modulation control are simultaneously performed, there is a possibility that the matching operation and the frequency modulation control interfere with each other and are not appropriately performed.

The present disclosure provides a high-frequency power supply device capable of appropriately performing the matching operation and the frequency modulation control.

SUMMARY

In a high-frequency power supply device according to the present disclosure, a first power supply supplies a first high-frequency power to a load by outputting a first high-frequency voltage. The first high-frequency voltage has a first fundamental frequency. A second power supply supplies second high-frequency power to the load by outputting a second high-frequency voltage. The second high-frequency voltage has a second fundamental frequency. The second fundamental frequency is lower than the first fundamental frequency. The first matching unit is connected between the first power supply and the load. A second matching unit is connected between the second power supply and the load. The first matching unit performs a first matching operation in a state where intermodulation distortion occurs. The intermodulation distortion occurs when the first high-frequency power and the second high-frequency power are simultaneously supplied to the load. The first matching operation is an operation of matching an impedance of the first power supply and an impedance of the load. The first power supply performs frequency modulation control after the first matching operation is completed. The frequency modulation control is control in which the first high-frequency voltage is frequency-modulated with a modulation signal and output the modulated voltage as a modulated wave. The modulation signal has the same frequency as the second fundamental frequency.

BRIEF DESCRIPTION OF THE DRAWINGS

FIG. 2 is a sequence diagram illustrating a schematic operation of the high-frequency power supply device according to the embodiment; and FIG. 3 is a sequence diagram illustrating a detailed operation of the high-frequency power supply device according to the embodiment.

DETAILED DESCRIPTION

Figure 1:
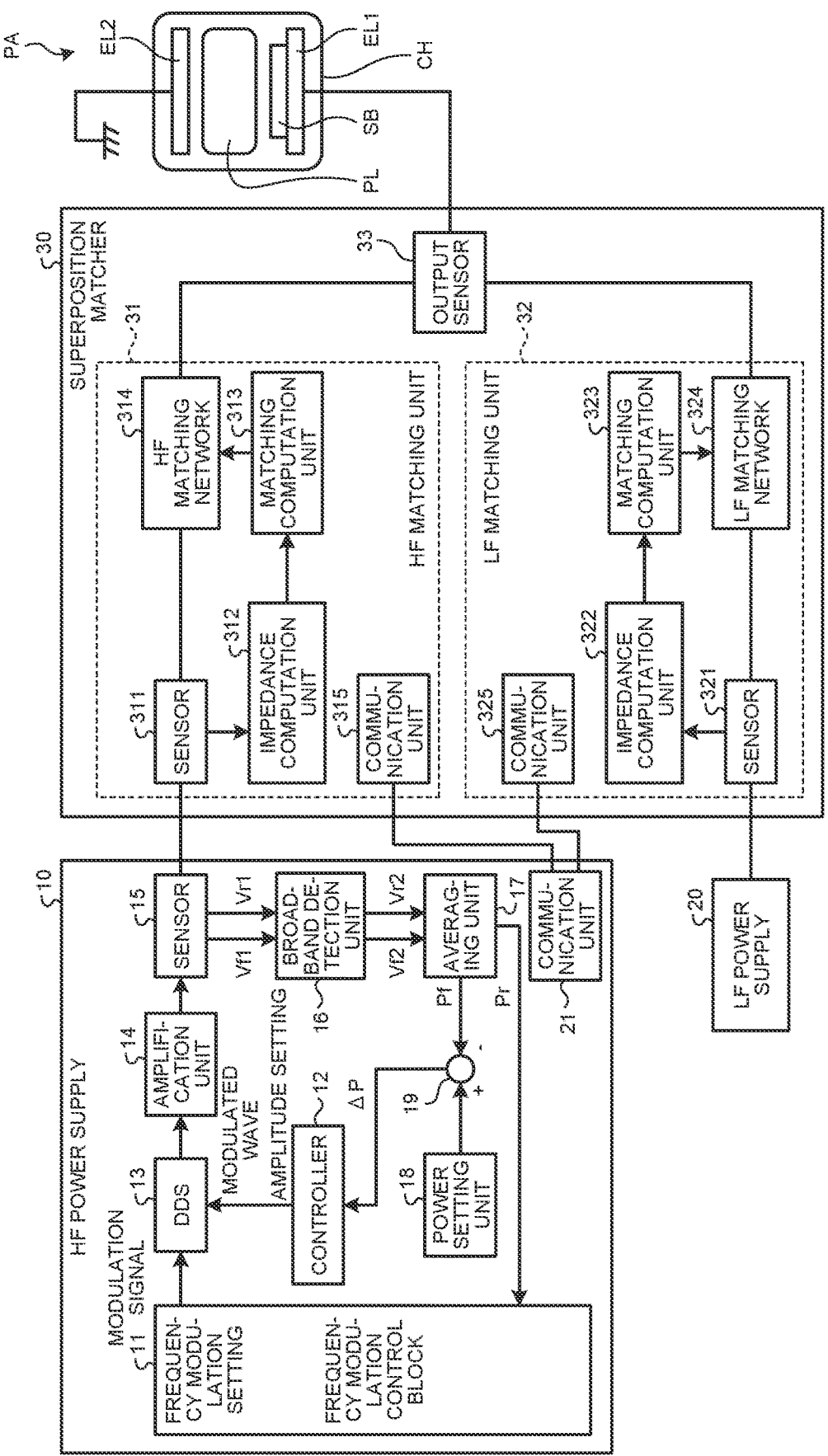
FIG. 1 is a block diagram illustrating a configuration of a high-frequency power supply device according to an embodiment.

Hereinafter, an embodiment of the high-frequency power supply device according to the present disclosure will be described with reference to the drawings.

EMBODIMENT

The high-frequency power supply device according to the embodiment is a device that supplies high-frequency power to a load (for example, a plasma processing device) by outputting a high-frequency voltage having a frequency in a radio frequency (RF) band. Such high-frequency power supply device includes two high-frequency power supplies (a first power supply and a second power supply), and outputs high-frequency voltages having different fundamental frequencies (frequencies of fundamental waves) (also referred to as output frequencies) from the respective power supplies toward a load. For example, the first power supply supplies a first high-frequency power to the load by outputting a first high-frequency voltage having a first fundamental frequency F1 suitable for plasma generation. The second power supply supplies a second high-frequency power to the load by outputting a second high-frequency voltage having a second fundamental frequency F2 (first fundamental frequency F1>second fundamental frequency F2) suitable for ion acceleration.

When a plurality of high-frequency powers having difference in height is supplied from a plurality of power supplies to a load as described above, a phenomenon in which reflected wave power fluctuates according to a basic cycle (cycle of the fundamental wave) on the second power supply side occurs on the first power supply side due to an influence of intermodulation distortion, and there is a possibility that high reflected power occurs. In order to reduce the reflected power, the frequency modulation control may be performed on the first high-frequency voltage at the first power supply, and impedance matching operation may be performed by a superposition matcher between the first power supply and the load. When the frequency modulation control and the impedance matching operation are performed at the same time, there is a possibility that the respective operations interfere with each other and cannot be appropriately performed. Therefore, in the present embodiment, the matching operation and the frequency modulation control are coordinated as described below to effectively reduce the reflected wave power.

Note that the high-frequency voltage output from the first power supply to the load is referred to as a first traveling wave voltage, and the high-frequency voltage reflected from the load side and returned to the first power supply is referred to as a first reflected wave voltage. The high-frequency voltage output from the second power supply to the load is referred to as a second traveling wave voltage, and the high-frequency voltage reflected from the load side and returned to the second power supply is referred to as a second reflected wave voltage.

FIG. 1 is a diagram illustrating a configuration of a high-frequency power supply device 1. The high-frequency power supply device 1 is applied to a plasma processing device PA. The plasma processing device PA is, for example, of a parallel plate type, and a lower electrode EL1 and an upper electrode EL2 face each other in a chamber CH. A substrate SB to be processed can be placed on the lower electrode EL1. The high-frequency power supply device 1 is electrically connected to the lower electrode EL1. The upper electrode EL2 is electrically connected to ground potential. The chamber CH is connected to a gas supply device (not illustrated) via an air supply pipe, and is connected to a vacuum device (not illustrated) via an exhaust pipe.

The high-frequency power supply device 1 includes an HF power supply (first power supply) 10, an LF power supply (second power supply) 20, and a superposition matcher 30. The HF power supply 10 supplies a first high-frequency power (first traveling wave power) to the load by outputting a first high-frequency voltage (first traveling wave voltage) having a first fundamental frequency F1. The first high-frequency voltage mainly has a relatively high first fundamental frequency F1 suitable for plasma generation. The first fundamental frequency F1 is, for example, 40.68 MHz. The HF power supply 10 is also referred to as the source power supply. Note that the fundamental frequency F1 is not limited to 40.68 MHz, and may be, for example, a frequency of an industrial radio frequency (RF) such as 13.56 MHz or 27.12 MHz.

The LF power supply 20 supplies a second high-frequency power (second traveling wave power) to the load by outputting a second high-frequency voltage (second traveling wave voltage) having a second fundamental frequency F2 lower than the first fundamental frequency F1. The second high-frequency voltage has a relatively low second fundamental frequency F2 suitable for ion acceleration. The second fundamental frequency F2 is, for example, 400 kHz. The LF power supply 20 is also referred to as the bias power supply. Note that the second fundamental frequency F2 is not limited to 400 kHz, but may be another frequency.

The superposition matcher 30 is electrically connected to both the HF power supply 10 and the LF power supply 20. The superposition matcher 30 is electrically connected between the HF power supply 10 and the LF power supply 20, and the lower electrode EL1. The superposition matcher 30 performs an HF matching operation of matching the impedance on the HF power supply 10 side with the impedance on the lower electrode EL1 side, and performs an LF matching operation of matching the impedance on the LF power supply 20 side with the impedance on the lower electrode EL1 side. In a state in which the HF matching operation and the LF matching operation are performed, the superposition matcher 30 receives the first high-frequency power from the HF power supply 10, receives the second high-frequency power from the LF power supply 20, superimposes the first high-frequency power and the second high-frequency power, and supplies the superimposed powers to the lower electrode EL1.

Note that the high-frequency power supply device 1 and the plasma processing device PA are not limited to the configuration of FIG. 1. For example, there are various configurations such that a configuration that the first high-frequency power output from the HF power supply 10 is supplied to the upper electrode EL2 via the superposition matcher 30, and the second high-frequency power output from the LF power supply 20 is supplied to the lower electrode EL1 via the superposition matcher 30. The high-frequency power supply device 1 can also be used for another configuration as described above.

The superposition matcher 30 includes an HF matching unit (first matching unit) 31, an LF matching unit (second matching unit) 32, and an output sensor 33. The HF matching unit 31 is electrically connected between the HF power supply 10 and the lower electrode EL1. The LF matching unit 32 is electrically connected between the LF power supply 20 and the lower electrode EL1. The HF matching unit 31 performs the HF matching operation, and the LF matching unit 32 performs the LF matching operation.

The output sensor 33 detects a third traveling wave voltage at the output end of the superposition matcher 30, outputs a traveling wave voltage detection signal $SG3f$ as a detection signal, detects a third reflected wave voltage at the output end of the superposition matcher 30, and outputs a reflected wave voltage detection signal $SG3f$ as a detection signal. The traveling wave voltage detection signal $SG3f$ and the reflected wave voltage detection signal $SG3f$ are output, for example, to an external device, which is not illustrated.

The HF matching unit 31 has a function of computing the magnitude of a reflection coefficient $\Gamma$ or the magnitude of the reflected power, on the basis of the information detected in the HF matching unit 31 when performing the HF matching operation.

The HF matching unit 31 includes a sensor 311, an impedance computation unit 312, a matching computation unit 313, an HF matching network 314, and a communication unit 315.

The sensor 311 detects the first traveling wave voltage output from the HF power supply 10, outputs a traveling wave voltage detection signal $SG1f$ as a detection signal, detects the first reflected wave voltage reflected from the HF matching network 314 side, and outputs a reflected wave voltage detection signal $SG1r$ as a detection signal. The traveling wave voltage detection signal $SG1f$ and the reflected wave voltage detection signal $SG1r$ are supplied to the impedance computation unit 312.

The impedance computation unit 312 obtains the impedance on the HF power supply 10 side on the basis of the traveling wave voltage detection signal $SG1f$ and the reflected wave voltage detection signal $SG1r$. The impedance computation unit 312 obtains the reflection coefficient $\Gamma$, which is a ratio of the first reflected wave voltage to the first traveling wave voltage. The impedance computation unit 312 supplies the reflection coefficient $\Gamma$ to the matching computation unit 313.

Upon receiving the reflection coefficient $\Gamma$, the matching computation unit 313 obtains an impedance change amount that reduces the reflection coefficient $\Gamma$. The matching computation unit 313 controls the HF matching network 314 according to the impedance change amount, and changes the impedance value of the HF matching network 314. Note that the impedance computation unit 312 may obtain reflected power instead of the reflection coefficient Γ, and the matching computation unit 313 may obtain an impedance change amount that reduces the reflected power instead of the reflection coefficient Γ.

Thus, when the magnitude of the reflection coefficient Γ or the magnitude of the reflected wave power computed becomes equal to or less than a predetermined threshold value, the HF matching unit 31 can consider that the HF matching operation is completed. Thus, the timing of completion of the HF matching operation can be clarified. Accordingly, the communication unit 315 can transmit a completion notification indicating that the HF matching operation is completed to the HF power supply 10.

The LF matching unit 32 has a function of computing the magnitude of a reflection coefficient Γ or the magnitude of the reflected power, on the basis of the information detected in the LF matching unit 32 when performing the LF matching operation.

The LF matching unit 32 includes a sensor 321, an impedance computation unit 322, a matching computation unit 323, an LF matching network 324, and a communication unit 325.

The sensor 321 detects the second traveling wave voltage output from the LF power supply 20, outputs a traveling wave voltage detection signal SG2f as a detection signal, detects the first reflected wave voltage reflected from the HF matching network 314 side, and outputs a reflected wave voltage detection signal SG2r as a detection signal. The traveling wave voltage detection signal SG2f and the reflected wave voltage detection signal SG2r are supplied to the impedance computation unit 322.

The impedance computation unit 322 obtains the impedance on the LF power supply 20 side on the basis of the traveling wave voltage detection signal SG2f and the reflected wave voltage detection signal SG2r. The impedance computation unit 322 obtains the reflection coefficient Γ, which is a ratio of the second reflected wave voltage to the second traveling wave voltage. The impedance computation unit 312 supplies the reflection coefficient Γ to the matching computation unit 313.

Upon receiving the reflection coefficient Γ, the matching computation unit 323 obtains an impedance change amount that reduces the reflection coefficient Γ. The matching computation unit 323 controls the LF matching network 324 according to the impedance change amount, and changes the impedance value of the LF matching network 324. Note that the impedance computation unit 322 may obtain reflected power instead of the reflection coefficient Γ, and the matching computation unit 323 may obtain an impedance change amount that reduces the reflected power instead of the reflection coefficient Γ.

Thus, when the magnitude of the reflection coefficient Γ or the magnitude of the reflected wave power computed becomes equal to or less than a predetermined threshold value, the LF matching unit 32 can consider that the LF matching operation is completed. Thus, the timing of completion of the LF matching operation can be clarified. Accordingly, the communication unit 325 can transmit a completion notification indicating that the LF matching operation is completed to the HF power supply 10.

The HF power supply 10 performs frequency modulation control of frequency-modulating the first high-frequency voltage with a modulation signal having the same frequency as the second fundamental frequency and outputting it as a modulated wave. The HF power supply 10 has a function of computing the magnitude of a reflection coefficient Γ or the magnitude of the reflected wave power, on the basis of the information detected in the HF power supply 10.

The HF power supply 10 includes a frequency modulation control block 11, a controller 12, a direct digital synthesizer (DDS) 13, an amplification unit 14, a sensor 15, a broadband detection unit 16, an averaging unit 17, a power setting unit 18, a subtractor 19, and a communication unit 21. The frequency modulation control block 11 generates a modulation fundamental wave. The modulation fundamental wave has a frequency F2 and a reference amplitude. The frequency modulation control block 11 generates a modulation signal by setting a start phase at which modulation is to be started and a frequency shift amount indicating the degree of modulation to the modulation fundamental wave on the basis of a trigger signal having a timing corresponding to the LF power supply 20. The modulation signal includes the start phase and the frequency shift amount. The frequency modulation control block 11 supplies the modulation signal as a frequency modulation setting to the direct digital synthesizer 13. The direct digital synthesizer 13 uses the frequency modulation setting (that is, the modulation signal) and the amplitude setting to generate a modulated wave having the same frequency as the second fundamental frequency F2, and supplies the modulated wave to the amplification unit 14. The amplification unit 14 amplifies the modulated wave and supplies the amplified modulated wave to the sensor 15.

The sensor 15 supplies the modulated wave (traveling wave) output from the amplification unit 14 to the superposition matcher 30. In addition, it detects the first traveling wave voltage from the amplification unit 14, outputs a traveling wave voltage detection signal Vf1 as a detection signal, detects the first reflected wave voltage reflected from the plasma processing device PA side via the superposition matcher 30, and outputs a reflected wave voltage detection signal Vr1 as a detection signal. The sensor 15 supplies the detected traveling wave voltage detection signal Vf1 and reflected wave voltage detection signal Vr1 to the broadband detection unit 16.

The broadband detection unit 16 is a filter that passes desired frequency components, and performs computation by, for example, the superheterodyne method and performs filtering processing to pass both a traveling wave voltage detection signal Vf2, which is a desired component of the traveling wave voltage detection signal Vf1, and a reflected wave voltage detection signal Vr2, which is a desired component of the reflected wave voltage detection signal Vr1, and supplies the signals to the averaging unit 17.

The averaging unit 17 calculates traveling wave power Pf on the basis of the traveling wave voltage detection signal Vf2 and calculates reflected wave power Pr on the basis of the reflected wave voltage detection signal Vr2. For example, the traveling wave power Pf can be calculated by $Vf2^2/R$ (R: gain corresponding to resistance value). The reflected wave power Pr can also be calculated in the same manner. Note that, in the above calculation formula, Vf2 represents the magnitude of the traveling wave voltage detection signal Vf2. Of course, the gain for conversion to the actual power value is multiplied.

In addition, the averaging unit 17 accumulates the calculated traveling wave power Pf and reflected wave power Pr for a predetermined period. Further, the averaging unit 17 averages both the traveling wave power Pf and the reflected wave power Pr for a predetermined period. The averaging unit 17 supplies the average power of the traveling wave power Pf to the subtractor 19. In addition, the averaging unit 17 supplies the average power of the traveling wave power Pf and the average power of the reflected wave power Pr to the frequency modulation control block 11. Note that, in the above description, the example in which the averaging is performed after the power is calculated on the basis of the voltage has been described, but the power may be calculated after averaging of the voltage.

The target power is preset in the power setting unit 18. The power setting unit 18 supplies the target power to the subtractor 19. The subtractor 19 subtracts the average power of the traveling wave power Pf from the target power, and feeds back a subtraction result to the controller 12 as error $\Delta P$. The controller 12 controls the amplitude of the modulated wave according to the error $\Delta P$. That is, the controller 12 obtains the amplitude of the modulated wave according to the error $\Delta P$ (for example, that reduces the error $\Delta P$), and supplies the amplitude setting according to the obtained amplitude to the direct digital synthesizer 13.

For example, when the target power is 1,000 [W] and the average power of the traveling wave power Pf is 950 [W], since 50 [W] is short of the target power, an amplitude setting controller 24 controls the amplitude of the modulated wave so as to increase the traveling wave power Pf to be supplied to the load. For example, a known method such as PI control or PID control can be used to control the amplitude of the modulated wave.

Thus, the frequency modulation control block 11 adjusts the start phase of the modulation signal and the frequency shift amount of the modulated wave within predetermined adjustment ranges so that the average power of the reflected wave power Pr is minimized. When the average power of the reflected wave power Pr becomes equal to or less than a predetermined threshold value, the frequency modulation control block 11 can consider that the average power of the reflected wave power Pr is minimized. The frequency modulation control block 11 can consider that the frequency modulation control is completed when the average power of the reflected wave power Pr is considered to be minimized. Thus, the timing of completion of the frequency modulation control can be clarified. Accordingly, the communication unit 21 can transmit a completion notification indicating that the frequency modulation control is completed to the HF matching unit 31.

Next, a schematic operation of the high-frequency power supply device 1 will be described with reference to FIG. 2. FIG. 2 is a sequence diagram illustrating a schematic operation of the high-frequency power supply device 1. In FIG. 2, correspondence between an operation state of the high-frequency power supply device 1 and operations of the superposition matcher 30 and the HF power supply 10 is indicated in time series.

In ST1, both the HF power supply 10 and the LF power supply 20 are stopped, and power application by the HF power supply 10 and power application by the LF power supply 20 are not performed. The superposition matcher 30 waits at an initial value (SQ1), and the HF power supply 10 waits at an initial value (SQ7).

In ST2, the HF power supply 10 starts generating and outputting the first high-frequency voltage to the superposition matcher 30 (SQ8), and power application by the HF power supply 10 is performed. Accordingly, the superposition matcher 30 prepares the matching operation on the HF power supply 10 side (SQ2). At this time, the LF power supply 20 is stopped.

In ST3, both the power application by the HF power supply 10 and the power application by the LF power supply 20 are performed, and IMD (intermodulation distortion) occurs on the HF power supply 10 side. Accordingly, the superposition matcher 30 detects the IMD state and starts the matching operation (first matching operation) on the HF power supply 10 side and the matching operation (third matching operation) on the LF power supply 20 side (SQ3). The superposition matcher 30 detects the waveform of the traveling wave and the waveform of the reflected wave on each of the HF power supply 10 side and the LF power supply 20 side, computes the impedance according to the detection result, and starts operating a variable impedance element while obtaining the reflection coefficient $\Gamma$ accordingly.

In ST4, both the power application by the HF power supply 10 and the power application by the LF power supply 20 are performed, and IMD (intermodulation distortion) occurs on the HF power supply 10 side, but the matching operation by the superposition matcher 30 is performed. At this time, since the frequency modulation control by the HF power supply 10 is not performed, the matching operation by the superposition matcher 30 can be performed without interference between the matching operation and the frequency modulation control. Then, after the state in which the matching operation on the HF power supply 10 side and the matching operation on the LF power supply 20 side are being executed (SQ4), the superposition matcher 30 determines that the matching operation is completed for each of the HF power supply 10 side and the LF power supply 20 side when the reflected power (or reflection coefficient $\Gamma$) becomes equal to or less than the threshold value (SQ5). At this time, the operation of the variable impedance element used for the matching operation on the HF power supply 10 is stopped (SQ6). Accordingly, the superposition matcher 30 transmits a completion notification indicating that the matching operation on the HF power supply 10 side is completed to the HF power supply 10. In response to receiving the completion notification, the HF power supply 10 recognizes that it is confirmed that the operation after matching on the HF power supply 10 side is stopped (SQ9).

In ST5, both the power application by the HF power supply 10 and the power application by the LF power supply 20 are performed, IMD (intermodulation distortion) occurs on the HF power supply 10 side, and the frequency modulation control by the HF power supply 10 is performed. When the frequency modulation control is started (SQ10), the HF power supply 10 acquires the reflected power and performs the frequency modulation control while searching for a condition under which the reflected power is minimized (SQ11). At this time, the reflected power is in a state of being suppressed to some extent by the matching operation of ST4. In addition, since the matching operation in the superposition matcher 30 is completed at the end of ST4, the matching operation and the frequency modulation control do not interfere with each other. Therefore, the frequency modulation control can be efficiently performed.

When the reflected power (or reflection coefficient $\Gamma$) becomes equal to or less than the threshold value, the HF power supply 10 considers that the frequency modulation control is completed (SQ12). Accordingly, the HF power supply 10 transmits a completion notification indicating that the frequency modulation control is completed to the superposition matcher 30. In response to receiving the completion notification, the superposition matcher 30 recognizes that it is confirmed that the frequency modulation control is completed (SQ13).

In ST6, both the power application by the HF power supply 10 and the power application by the LF power supply 20 are performed, IMD (intermodulation distortion) is suppressed on the HF power supply 10 side, and the matching operation by the superposition matcher 30 is performed. Since the matching state can be changed by the frequency modulation control, the superposition matcher 30 performs the matching operation again. At this time, since the reflected wave power by the IMD is reduced by the frequency modulation control, the reflected wave power due to impedance mismatching can be efficiently reduced by the matching operation. The superposition matcher 30 computes the impedance on the HF power supply 10 side (SQ14), starts the matching operation (second matching operation) on the HF power supply 10 side accordingly (SQ15), and determines that the matching operation is completed when the reflected power (or reflection coefficient $\Gamma$) becomes equal to or less than the threshold value (SQ16).

Next, a detailed operation of the high-frequency power supply device 1 will be described with reference to FIG. 3. FIG. 3 is a sequence diagram illustrating a detailed operation of the high-frequency power supply device 1. In FIG. 3, the operations of the LF power supply 20, the LF matching unit 32, the HF matching unit 31, and the HF power supply 10 are illustrated in time series.

Before activation of the high-frequency power supply device 1, the LF power supply 20, the LF matching unit 32, the HF matching unit 31, and the HF power supply 10 wait at initial values (S1, S4, S11, and S8).

In response to the activation instruction of the high-frequency power supply device 1, the LF power supply 20 starts generating the second traveling wave voltage and outputting the second traveling wave voltage to the LF matching unit 32 (S2). Thereafter, the LF power supply 20 continuously generates the second traveling wave voltage and outputs the second traveling wave voltage to the LF matching unit 32 (S3).

When starting to detect the traveling wave voltage detection signal SG2$f$ output from the LF power supply 20, the LF matching unit 32 starts the LF matching operation (third matching operation) (S5). The LF matching unit 32 detects a waveform signal of the second traveling wave voltage and a waveform signal of the second reflected wave voltage, and computes the impedance on the LF power supply 20 side according to the waveform signal of the second traveling wave voltage and the waveform signal of the second reflected wave voltage. The LF matching unit 32 obtains the reflected power (or reflection coefficient $\Gamma$) according to the impedance on the LF power supply 20 side. The LF matching unit 32 obtains an impedance change amount that reduces the reflected power (or reflection coefficient $\Gamma$), and operates the variable impedance element with the impedance change amount. Thus, the LF matching unit 32 performs the LF matching operation (S6). The LF matching unit 32 compares the reflected power (or reflection coefficient $\Gamma$) with a predetermined threshold value while performing the LF matching operation. The LF matching unit 32 considers that the LF matching operation is completed when the magnitude of the reflected power (or reflection coefficient $\beta$) becomes equal to or less than the predetermined threshold value (S7). Accordingly, the LF matching unit 32 transmits a completion notification indicating that the LF matching operation is completed to the HF power supply 10.

On the other hand, in the high-frequency power supply device 1, the operations of S9, S10 and S12 to S22 are performed simultaneously with the operations of S2 to S7.

In response to the activation instruction of the high-frequency power supply device 1, the HF power supply 10 starts generating the first traveling wave voltage and outputting the first traveling wave voltage to the HF matching unit 31 (S9). Thereafter, the LF power supply 20 continuously generates the first traveling wave voltage and outputs the first traveling wave voltage to the HF matching unit 31 (S10).

When starting to detect the traveling wave voltage detection signal SG1$f$ output from the HF power supply 10, the HF matching unit 31 starts the HF matching operation (first matching operation) (S12). The HF matching unit 31 detects a waveform signal of the first traveling wave voltage and a waveform signal of the first reflected wave voltage, and computes the impedance on the HF power supply 10 side according to the waveform signal of the first traveling wave voltage and the waveform signal of the first reflected wave voltage. The HF matching unit 31 obtains the reflected power (or reflection coefficient $\Gamma$) according to the impedance on the HF power supply 10 side. The HF matching unit 31 obtains an impedance change amount that reduces the reflected power (or reflection coefficient $\Gamma$), and operates the variable impedance element with the impedance change amount. Thus, the HF matching unit 31 performs the HF matching operation (S13). The HF matching unit 31 compares the reflected power (or reflection coefficient $\Gamma$) with a predetermined threshold value while performing the HF matching operation. The HF matching unit 31 considers that the HF matching operation is completed when the magnitude of the reflected power (or reflection coefficient $\beta$) becomes equal to or less than the predetermined threshold value (S14). Accordingly, the HF matching unit 31 transmits a completion notification indicating that the HF matching operation is completed to the HF power supply 10.

Upon receiving the completion notification from the HF matching unit 31, the HF power supply 10 confirms that the HF matching operation has been completed in response to the completion notification from the HF matching unit 31. Upon receiving the completion notification from the LF matching unit 32, the HF power supply 10 confirms that the LF matching operation has been completed in response to the completion notification from the LF matching unit 32 (S15). The HF power supply 10 starts the frequency modulation control in response to completion of the HF matching operation and the LF matching operation (S16). The HF power supply 10 performs frequency modulation control of frequency-modulating the first high-frequency voltage with a modulation signal having the same frequency as the second fundamental frequency and outputting it as a modulated wave. At the time of the frequency modulation control, the HF power supply 10 acquires reflected power and searches for a condition under which the reflected power is minimized, that is, a combination of the start phase of the modulation signal and the frequency shift amount of the modulated wave. The HF power supply 10 performs the frequency modulation control while adjusting the start phase of the modulation signal and the frequency shift amount of the modulated wave within predetermined adjustment ranges, and detects the waveform of the first traveling wave voltage and the waveform of the first reflected wave voltage Pr to obtain the reflected power (or reflection coefficient $\Gamma$). Thus, the HF power supply 10 performs the frequency modulation control (S17) while searching for a condition under which the reflected power (or reflection coefficient $\Gamma$) is minimized. At this time, since the reflected power on the HF side is suppressed to some extent by the matching operations of S12 to S13, the frequency modulation control can be efficiently performed. The HF power supply 10 can compare the reflected power (or reflection coefficient $\Gamma$) with the threshold value and consider that the reflected power is minimized when the reflected power (or reflection coefficient Γ) becomes equal to or less than the threshold value. When the reflected power is considered to be minimized, the HF power supply 10 considers that the frequency modulation control is completed (S18).

Accordingly, the HF power supply 10 transmits a completion notification indicating that the frequency modulation control is completed to the HF matching unit 31.

Upon receiving the completion notification, the HF matching unit 31 confirms that the frequency modulation control has been completed in response to the completion notification (S19). In response to completion of the frequency modulation control, the HF matching unit 31 starts the HF matching operation (second matching operation) again (S20). At this time, since the reflected wave power by the IMD is reduced by the frequency modulation control, the reflected wave power due to impedance mismatching can be efficiently reduced by the HF matching operation. The HF matching unit 31 detects a waveform signal of the first traveling wave voltage and a waveform signal of the first reflected wave voltage, and computes the impedance on the HF power supply 10 side according to the waveform signal of the first traveling wave voltage and the waveform signal of the first reflected wave voltage. The HF matching unit 31 obtains the reflected power (or reflection coefficient Γ) according to the impedance on the HF power supply 10 side. The HF matching unit 31 obtains an impedance change amount that reduces the reflected power (or reflection coefficient Γ), and operates the variable impedance element with the impedance change amount. Thus, the HF matching unit 31 performs the HF matching operation (S21). The HF matching unit 31 compares the reflected power (or reflection coefficient Γ) with a predetermined threshold value while performing the HF matching operation. The HF matching unit 31 considers that the HF matching operation is completed when the magnitude of the reflected power (or reflection coefficient Γ) becomes equal to or less than the predetermined threshold value (S22). In the state in which the HF matching operation and the LF matching operation are performed, the superposition matcher 30 receives the first traveling wave voltage from the HF power supply 10 with the HF matching unit 31, and receives the second traveling wave voltage from the LF power supply 20 with the LF matching unit 32. The superposition matcher 30 superimposes the first traveling wave voltage (first high-frequency power) of the HF matching unit 31 and the second traveling wave voltage (second high-frequency power) of the LF matching unit 32, and supplies the superimposed voltages to the lower electrode EL1 (S23).

As described above, in the present embodiment, in the high-frequency power supply device 1, the HF power supply 10 performs the frequency modulation control after the HF matching operation by the HF matching unit 31 is completed. Thus, the HF matching operation and the frequency modulation control can be appropriately performed, and the reflected wave power on the HF power supply 10 side generated by the influence of the intermodulation distortion can be efficiently reduced.

In addition, in the present embodiment, in the high-frequency power supply device 1, the HF matching unit 31 performs the HF matching operation again after the frequency modulation control by the HF power supply 10 is completed. For example, by performing the frequency modulation control, an optimum value (an optimum state of a matching circuit) of the HF matching operation in the HF matching unit 31 may be different. Therefore, by performing the HF matching operation again, the reflected wave power generated by the influence of the intermodulation distortion can be further reduced.

In addition, in the present embodiment, in the high-frequency power supply device 1, the HF power supply 10 performs the frequency modulation control after the LF matching operation by the LF matching unit 32 is completed in addition to the completion of the HF matching operation by the HF matching unit 31. Thus, the HF matching operation, the LF matching operation, and the frequency modulation control can be appropriately performed, and the reflected wave power on the HF power supply 10 side and the reflected wave power on the LF power supply 20 side generated by the influence of the intermodulation distortion can be efficiently reduced.

In addition, in the present embodiment, in the high-frequency power supply device 1, the HF matching unit 31 acquires the reflected power (or reflection coefficient Γ) while performing the HF matching operation, and determines that the HF matching operation is completed when the magnitude of the reflected power (or reflection coefficient Γ) becomes equal to or less than the predetermined threshold value. The LF matching unit 32 acquires the reflected power (or reflection coefficient Γ) while performing the LF matching operation, and determines that the LF matching operation is completed when the magnitude of the reflected power (or reflection coefficient Γ) becomes equal to or less than the predetermined threshold value. Thus, the completion timing of the HF matching operation and the completion timing of the LF matching operation become clear, and the matching operation can be performed within an appropriate range (it is sufficient if the threshold value is set to an appropriate value by experiment or the like). That is, when the target is that the reflected power becomes zero, the control is repeatedly performed even when the reflected power becomes small and the control may become unstable, but the instability is reduced as described above. In addition, the control can be completed early.

In addition, in the present embodiment, in the high-frequency power supply device 1, the HF power supply 10 acquires the reflected power (or reflection coefficient Γ) while performing the frequency modulation control by adjusting the start phase of the modulation signal and the frequency shift amount of the modulated wave within predetermined adjustment ranges at the time of the frequency modulation control, and considers that the frequency modulation control is completed when the magnitude of the reflected power (or reflection coefficient Γ) is considered to be minimized. Thus, the completion timing of the frequency modulation control becomes clear, and the frequency modulation control can be performed in an appropriate range (it is sufficient if the threshold value is set to an appropriate value by experiment or the like). That is, when the target is that the reflected wave power becomes zero, the control is repeatedly performed even when the reflected wave power becomes small and the control may become unstable, but the instability is reduced as described above. In addition, the control can be completed early.

With the high-frequency power supply device according to the present disclosure, the matching operation and the frequency modulation control can be appropriately performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high-frequency power supply device comprising:
a first power supply that supplies first high-frequency power to a load by outputting a first high-frequency voltage having a first fundamental frequency;
a second power supply that supplies second high-frequency power to the load by outputting a second high-frequency voltage having a second fundamental frequency lower than the first fundamental frequency;
a first matching unit connected between the first power supply and the load; and
a second matching unit connected between the second power supply and the load, wherein
the first matching unit performs a first matching operation of matching an impedance of the first power supply with an impedance of the load in a state in which intermodulation distortion occurs, the intermodulation distortion being caused by the first high-frequency power and the second high-frequency power being simultaneously supplied to the load, and
the first power supply performs frequency modulation control of frequency-modulating the first high-frequency voltage with a modulation signal having a same frequency as the second fundamental frequency and outputting it as a modulated wave after the first matching operation is completed.

2. The high-frequency power supply device according to claim 1, wherein
the first matching unit performs a second matching operation of matching the impedance of the first power supply with the impedance of the load after the frequency modulation control is completed.

3. The high-frequency power supply device according to claim 2, wherein
the second matching unit performs a third matching operation of matching an impedance of the second power supply with the impedance of the load, and
the first power supply performs the frequency modulation control after the first matching operation and the third matching operation are completed.

4. The high-frequency power supply device according to claim 1, wherein
the second matching unit performs a third matching operation of matching the impedance of the second power supply with the impedance of the load,
the first matching unit has a function of computing magnitude of reflection coefficient or magnitude of reflected power, based on information detected in the first matching unit, and considers that the first matching operation is completed when the magnitude of the reflection coefficient or the magnitude of the reflected wave power computed becomes equal to or less than a predetermined threshold value, and
the second matching unit has a function of computing magnitude of reflection coefficient or magnitude of reflected wave power, based on information detected in the second matching unit, and considers that the third matching operation is completed when the magnitude of the reflection coefficient or the magnitude of the reflected wave power computed becomes equal to or less than a predetermined threshold value.

5. The high-frequency power supply device according to claim 1, wherein
the first power supply has a function of computing magnitude of reflection coefficient or magnitude of reflected wave power, based on information detected in the first power supply, and
the frequency modulation control adjusts a start phase of the modulation signal and a frequency shift amount of the modulated wave within predetermined adjustment ranges, and considers that the frequency modulation control is completed when the magnitude of the reflection coefficient or the magnitude of reflected wave power computed is considered to be minimized.

* * * * *